United States Patent
Goh et al.

(10) Patent No.: US 9,739,831 B2
(45) Date of Patent: Aug. 22, 2017

(54) DEFECT ISOLATION METHODS AND SYSTEMS

(71) Applicant: GLOBALFOUNDRIES Singapore Pte. Ltd., Singapore (SG)

(72) Inventors: Szu Huat Goh, Singapore (SG); Yin Hong Chan, Gelugor (MY); Boon Lian Yeoh, Teluk Intan (MY); Jeffrey Chor Keung Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 13 days.

(21) Appl. No.: 14/824,104

(22) Filed: Aug. 12, 2015

(65) Prior Publication Data

US 2016/0047858 A1 Feb. 18, 2016

Related U.S. Application Data

(60) Provisional application No. 62/036,128, filed on Aug. 12, 2014, provisional application No. 62/184,262, filed on Jun. 25, 2015.

(51) Int. Cl.
*G01R 31/311* (2006.01)

(52) U.S. Cl.
CPC .................. *G01R 31/311* (2013.01)

(58) Field of Classification Search
CPC combination set(s) only.
See application file for complete search history.

(56) References Cited

U.S. PATENT DOCUMENTS

| | | | |
|---|---|---|---|
| 6,308,290 B1 | 10/2001 | Forlenza et al. | |
| 6,549,022 B1 | 4/2003 | Cole, Jr. et al. | |
| 2006/0066325 A1* | 3/2006 | McGinnis | G01R 31/311 324/754.23 |
| 2008/0301597 A1* | 12/2008 | Chen | G01R 31/2894 716/136 |
| 2009/0271675 A1* | 10/2009 | Dickson | G01R 31/311 714/732 |

OTHER PUBLICATIONS

M.R.Bruce et al., "Soft Defect Localization (SDL) on ICs", Proceedings of the 28th International Symposium for Testing and Failure Analysis (ASM International), Oct. 2002, pp. 21-27, ISTFA.
Christian Burmer et al., "Soft Defects: Challenge and Chance for Failure Analysis", Physical and Failure Analysis of Integrated Circuits, 14th International Symposium on the, 2007, IEEE.
Jeremy Rowlette et al., "Critical Timing Analysis in Microprocessors Using Near-IR Laser Assisted Device Alteration (LADA)", ITC International Test Conference, Jan. 2003, vol. 1, pp. 264-273, IEEE.

* cited by examiner

*Primary Examiner* — Clayton E Laballe
*Assistant Examiner* — Jas Sanghera
(74) *Attorney, Agent, or Firm* — Horizon IP PTE LTD.

(57) ABSTRACT

A test system and method for testing integrated circuits with improved defect localization is disclosed. A laser is used to perturb a device under test (DUT) at a test location. A tester tests the DUT with a test pattern and compares test results with compare vectors in a prior failure log. When a failure signature is matched, a failure signal is generated, indicating that the test location is a failed location. Comparing the test results with the compare vectors in the prior failure log and generating the failure signal when the failure signature is detected reduces artifacts from testing, shortening debug turnaround time.

20 Claims, 9 Drawing Sheets

| | a | b | c | d | e | f |
|---|---|---|---|---|---|---|
| 1 | H | L | L | L | H | H |
| 2 | H | L | H | H | H | L |
| 3 | L | L | H | H | L | L |
| 4 | H | H | L | H | L | H |
| 5 | L | L | H | H | H | L |
| 6 | L | H | H | L | L | H |
| 7 | H | L | L | H | H | H |

DEFECT ISOLATION METHODS AND SYSTEMS

CROSS-REFERENCE TO RELATED APPLICATIONS

This application claims priority of U.S. Provisional Application No. 62/036,128 entitled "Precision of tester-based laser-assisted defect localization" filed on Aug. 12, 2014 and U.S. Provisional Application No. 62/184,262 entitled "Electrically enhanced Laser Assisted Device Alteration (Ee-LADA) for Integrated Circuits Defect Localization" filed on Jun. 25, 2015, the disclosures of which are herein incorporated by reference in their entireties for all purposes.

BACKGROUND

Integrated circuits (ICs) may include billions of transistors designed as logic circuitries which perform specific functions. After manufacturing, functionality of the ICs are tested using for example, IC testers. A failure event triggers a failure analysis flow to identify causation of the failure. For example, the failure analysis flow debugs the failures.

An important aspect of debugging is defect localization, such as hot spots. However, conventional IC testers generates large amount of artifacts (false hot spots) along with the hot spots. The large number of artifacts increases the amount of time for debugging the failure. This negatively impacts product yield ramp, decreasing profit margin.

From the foregoing discussion, it is desirable to improve defect localization.

SUMMARY

Embodiments generally relate to a defect localization in ICs. In one embodiment, a test system for testing ICs is disclosed. The test system includes a scanning microscope module. The scanning microscope module is configured to perturb a device under test (DUT) with a laser at a test (pixel) location of the DUT. The test system includes a test module with a tester unit, a reference failure log containing prior failing compare vectors of interest, and a comparator unit. The test unit is configured to perform a test run at the test location of the DUT with a test pattern. The test results of the test run are compared with the prior failing compare vectors in the reference failure log by the comparator unit. A failure signal is generated if the test result matches a prior failure signature. The failure signal indicates that the test location of the DUT is a failed location.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following ring drawings, in which.

DETAILED DESCRIPTION

Embodiments generally relate to devices, for example, semiconductor devices or integrated circuits (ICs). More particularly, embodiments relate to testing or analyzing devices or ICs in the manufacturing process to localize defects. Defect localization is facilitated by a laser assisted device alteration (LADA) analysis system. The ICs tested can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

Figure 1:
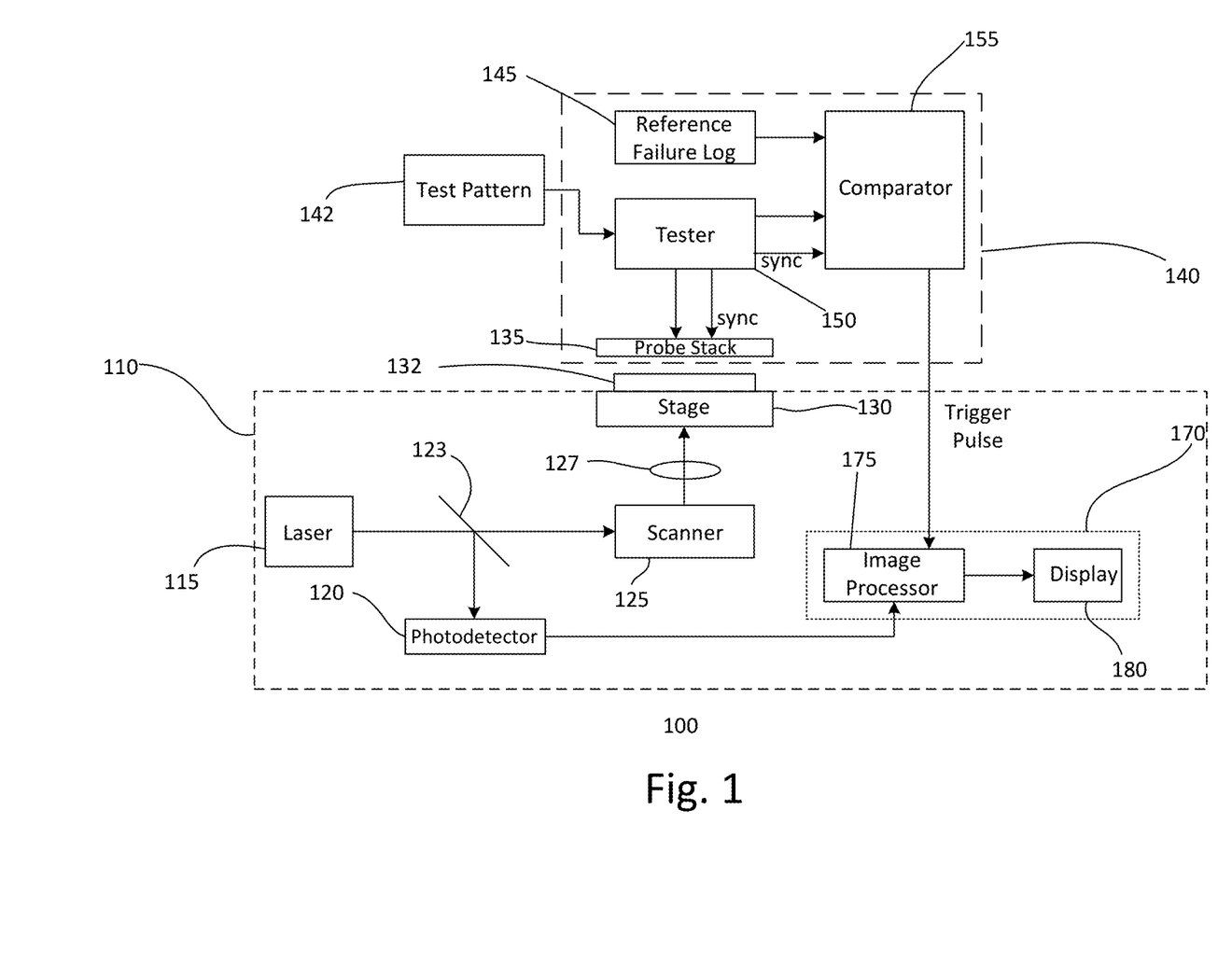
FIGS. 1-3 show block diagrams of various embodiments of a test system for defect localization.

FIG. 1 shows a simplified block diagram of an exemplary analysis or diagnostic system 100. The analysis system facilitates defect isolation for ICs. In one embodiment, the analysis system includes a scanning microscope module 110 and a test module 140. Providing the test system with other modules may also be useful.

In one embodiment, the scanning microscope module 110 includes a laser source 115, a photodetector unit 120, a beam splitter 123, a scanner unit 125, a focusing unit 127, a test stage 130, and an imaging unit 170 with an image processor 175 and a display 180. The scanning microscope, for example, may be a commercially available laser scanning microscope. Such types of scanning microscopes may be from, for example, DCG systems, Hamamatsu, Semicaps and Checkpoint Technologies. Other types of scanning microscopes may also be useful. As for the test module 140, it includes a reference failure log 145, a test unit 150, a probe stack 135 and a comparator 155. The test unit, for example, may be a commercially available tester from, for example, Advantest, Teradyne, LTX-Credence, and National instruments. Other types of testers may also be useful. Providing the various modules with other units or components may also be useful.

The various modules are configured to analyze a device under test (DUT) 132. For example, a DUT is provided with test signals from the test module and scanned with a laser beam by the scanning microscope. The laser beam serves to perturb the DUT for testing as well as capture the DUT's image pixel-by-pixel. The image of the DUT may be displayed on the display of the imaging unit to the user.

In operation to test a device, the DUT is mounted onto the test stage 130. For example, the test stage supports the DUT for testing. In one embodiment, the DUT is an IC. The DUT may be an individual IC. For example, the DUT may be a die which has been singulated from a wafer with a plurality of ICs by dicing the wafer. Providing unsingulated dies for testing on the test stage may also be useful. The IC includes a plurality of metallization layers formed over the substrate or wafer for interconnecting circuit components, such as transistors, capacitors and resistors. The side of the IC which has the metallization layers is referred to as the "frontside" while the opposite side of the IC is referred to as the "backside".

The IC includes a plurality of pins which allow access to the internal circuitry. For example, the pins may include power and signal pins. The power pins may include various power sources, including ground while signal pins may include input/output (I/O) pins. The signal pins may be bidirectional, unidirectional or a combination thereof. The pins may be in the form of pads for an unpackaged IC. In some cases, the pins may be contact bumps, such as a wafer level packaged IC. The pads or contact bumps are disposed on the frontside of the IC. In other cases, the IC may be a fully packaged IC. In such cases, at least a part of the package is removed for access by the scanning microscope. For example, at least the side of the package which covers the backside of the die is removed to expose the backside of the die for access by the scanning microscope. Decapping to expose the backside of the die may be achieved by laser or chemical techniques.

In one embodiment, the backside of the die or IC is disposed on the surface of the test stage. For example, the stage includes a cavity for accessing by the laser for scanning and defect isolation.

The laser generates a radiation or light beam which is directed to the backside of the die. For example, the beam is focused on the backside of the die through the test stage. The wavelength of the laser beam may be from about 1000-1400 nm. Other wavelengths may also be useful. The wavelength used may depend on the type or material of the substrate of the die as well as application method. For example, the wavelength should be below the bandgap of the substrate material of the die. The laser may be configured to operate as a continuous-wave laser or a pulsed laser.

In one embodiment, the laser is configured to operate as a pulsed laser (e.g., pulse mode). Various techniques may be employed to configure the laser to operate in the pulse mode. For example, an electro-optical modulator (EOM), a mode-locker, or a laser chopper may be employed. The frequency of the pulsed beam may be from about 1 kHz to about 10 KHz or greater. Other pulse frequencies may also be useful. We have discovered that higher frequencies are preferred. For example, a pulse width of a laser beam is preferably less than 200 µs. The pulse width may be about 50 µs. Other pulse widths may also be useful. In one embodiment, the duty cycle of the pulse width is about 50%. Other duty cycles may also be useful.

The system may be employed to identify soft or hard IC failures. In the case of identifying soft failures, the laser may be operated in either a continuous or a pulse mode. To identify hard failures, the laser is operated in the pulse mode. Other configurations of the laser for defect analysis may also be useful.

The incident laser beam is used to perturb the electrical characteristics of the transistors during testing. For example, the incident laser beam may serve as a heating source to heat the backside of the die to perturb the IC. The laser may be in continuous mode at a wavelength of around 1340 nm. To generate carriers, the laser may be in the continuous or pulse mode and the wavelength may be about 1064 nm. For example, the carrier generation can be caused by optical beam induced current (OBIC) effects.

The scanner is employed to scan the backside of the DUT with the laser beam. For example, the scanner is disposed in the path of the laser beam from the laser source and directs the beam to the backside of the DUT. The scanner, for example, may be controlled to scan the laser or laser beam in an x-y direction in the plane of the back of the DUT. Various types of scanners for scanning the laser may be used. For example, the scanner may be a step (non-continuous) or raster (continuous) scanner. The scanner, for example, scans the complete backside of the IC pixel-by-pixel. The scanner may include an output position signal which enables determination of the position of the laser beam on the backside of the die or DUT.

In one embodiment, the focusing unit, which is disposed in the beam path between the scanner and test stage, focuses the laser beam from the scanner to the backside of the IC. The focusing unit, for example, may be an optical column. For example, the focusing unit may include an objective lens for focusing the beam onto the backside of the IC. The lens may be an air gap or immersion lens. Other type of lenses or focusing units may also be useful. For example, the focusing unit may include curved mirrors. The focusing unit focuses the beam having a predetermined spot size. The spot size, for example, may be about 150-200 nm. Other spot sizes may also be useful. The spot size, for example, depends on the focal length of the lens of the focusing unit. The focal length of the lens can be selected depending on a desired resolution limit for the measurements.

The laser is also used to obtain a light image of the portion of the DUT or IC on which the beam is focused. The light image is obtained from the reflected laser beam. For example, the reflected laser beam from the backside of the DUT is sampled to obtain the image. The reflected laser beam is directed to the photodetector via the beam splitter, which is located between the laser and scanner. The photodetector unit detects the reflected beam and generates a detector output signal of the reflected image. For example, the photodetector unit detects the intensity of the reflected beam and generates a detector output signal.

The image processor processes the detector output signal and generates an image of the portion of the DUT sampled. The image, for example, is a reflected laser image of a pixel of the DUT sampled. The location of the pixel may be determined by the location output signal from the scanner. The image may be displayed on the display. For example, as each pixel of the DUT is scanned, the image may be displayed on the display in real time. The image may be stored in memory. For example, the reflected laser image may be stored in the processor's memory. The image may be stored in other storage locations. For example, the image may be stored in a server.

As discussed, a reflected laser image of the DUT may be obtained by scanning the whole DUT with the laser beam. For example, scanning the DUT pixel-by-pixel with the laser beam may be employed to generate a complete image of the DUT. In one embodiment, prior to commencing the testing, a complete image of the DUT is obtained.

As also discussed, the test module includes a reference failure log unit 145. The reference failure log unit contains prior failures of interest. The prior failures of interest, for example, are obtained from a sort test of failed ICs and logging the failing compare vectors. Other techniques for obtaining prior failures or failing compare vectors of interest may also be useful. In one embodiment, the failing compare vectors are test vectors of interest from the sort test.

As shown, the tester unit receives a test pattern 142 for testing the DUT. The test pattern, for example, is a 3-Dimensional (3-D) matrix of test vectors corresponding to specific pin names of the IC and cycle numbers. For example, the test vectors may be pointers to bias or a waveform table. The test vectors may be input or outputs. In the case of inputs, they serve as driving signals. In the case of outputs, also called compare test vectors, they serve as expected signals which are compared with actual outputs from the DUT corresponding to the cycle. The rising edge of the tester's clock signal may serve as a reference when input vectors are applied or when output vectors are compared. Typically, one vector or pin is tested per clock cycle. Testing more than one vector per clock cycle may also be useful. Typically, there are more than one pin under test in a clock cycle. Testing, for example, is performed after an image of the IC is obtained from an initial scan.

The probe stack 135 is mounted onto the DUT. For example, the probe stack includes electrical connections connected to pads or contacts of the IC. This enables the tester unit to communicate with the IC. For example, the probe stack provides a test pattern to the IC for testing as well as reads the outputs from the IC for comparison with expected values.

Within a test cycle, the laser beam scans the backside of the DUT to perturb the IC one test location (pixel location) at a time until the whole DUT is tested. Testing at each location may be referred to as a complete test nm of all the test cycles or test sequence. At each location or test run, the tester tests the IC with the test pattern. The result of the test pattern (e.g., measured or output test vector) is compared with the expected values of the test pattern to determine whether the output test vector is a failed test vector. For example, failed test vectors are output test vectors which do not match the expected values.

In one embodiment, the comparator is a programmable comparator. For example, the user may program the comparator to generate a trigger signal when the test failure vectors match a prior failure signature. The trigger signal, in one embodiment, is a pulse signal. The trigger signal, for example, indicates that the location tested is a failed or defect location. As discussed, the prior reference failure log contains a plurality of failing compare vectors of interest. A user may define a sub-group of the failing compare vectors of interest as a prior failure signature. The sub-group may be any number of the failing compare vectors of interest in the prior reference failure log. For example, in the case the prior failure reference log contains 10 failing compare vectors, the prior failure signature may contain from 1 to 10 of the failing compare vectors. In some cases, the user may define more than 1 prior failure signature. For example, the trigger signal may be generated whenever the group of failed test vectors matches a prior failure signature.

By enabling the user to program prior failure signatures, the testing can be tailored to filter out undesirable defect signals from desirable detect signals. For example, the stringency of the testing may be tailored by defining the desired failure signatures. The higher the number of prior failed vectors contained in the prior failure signature, the more stringent the failure detection. For example, the pixel is determined as a failed pixel only when the prior failure signature is satisfied. The more failing compare vectors in the failure signature, the more stringent the testing. For example, if the failure signature contains 10 failing compare vectors, all 10 must be detected before the defect is registered. If the testing is too stringent, no defect signals may be detected. However, if the testing is too lax, too many defect signals may be detected.

In one embodiment, the tester tests the DUT with the test pattern at each location. For example, a test run is performed at each location. During a test run, the tester tests the DUT with the test sequence. In one embodiment, the tester compares on the fly. For example, the tester tests the test sequence until a test cycle matches that in the prior failure signature. Each time a test cycle matches, the tester compares the output test vector with the compare vector of the prior failure signature. After completion of the test run, the programmable comparator determines whether a trigger signal is generated or not. In one embodiment, a trigger signal is generated if a prior failure signature defined by the user is detected. For example, if the failing compare vectors are all exhibited by the DUT, the programmable comparator generates a trigger signal.

The trigger signal is provided to the image processor. The trigger signal causes the processor to mark the location (pixel) as a failed pixel. For example, the image processor overlays a marker at the failed location onto the image of the DUT. The marker indicates that the pixel is a failed pixel.

The tester generates a test synchronization signal. The test synchronization, as shown, is provided to the scanning microscope module and the comparator unit. The test synchronization signal provides a reference to start a test run for testing a location of the DUT. For example, the various components of the scanning microscope and test modules operate based on the test synchronization signal. The test synchronization signal takes reference from, for example, the tester clock which commences the beginning of a test pattern run and the comparator unit is initiated based on a specified delay after the test synchronization signal. The synchronization signal is provided at the beginning of each test run at each pixel location.

Figure 2:
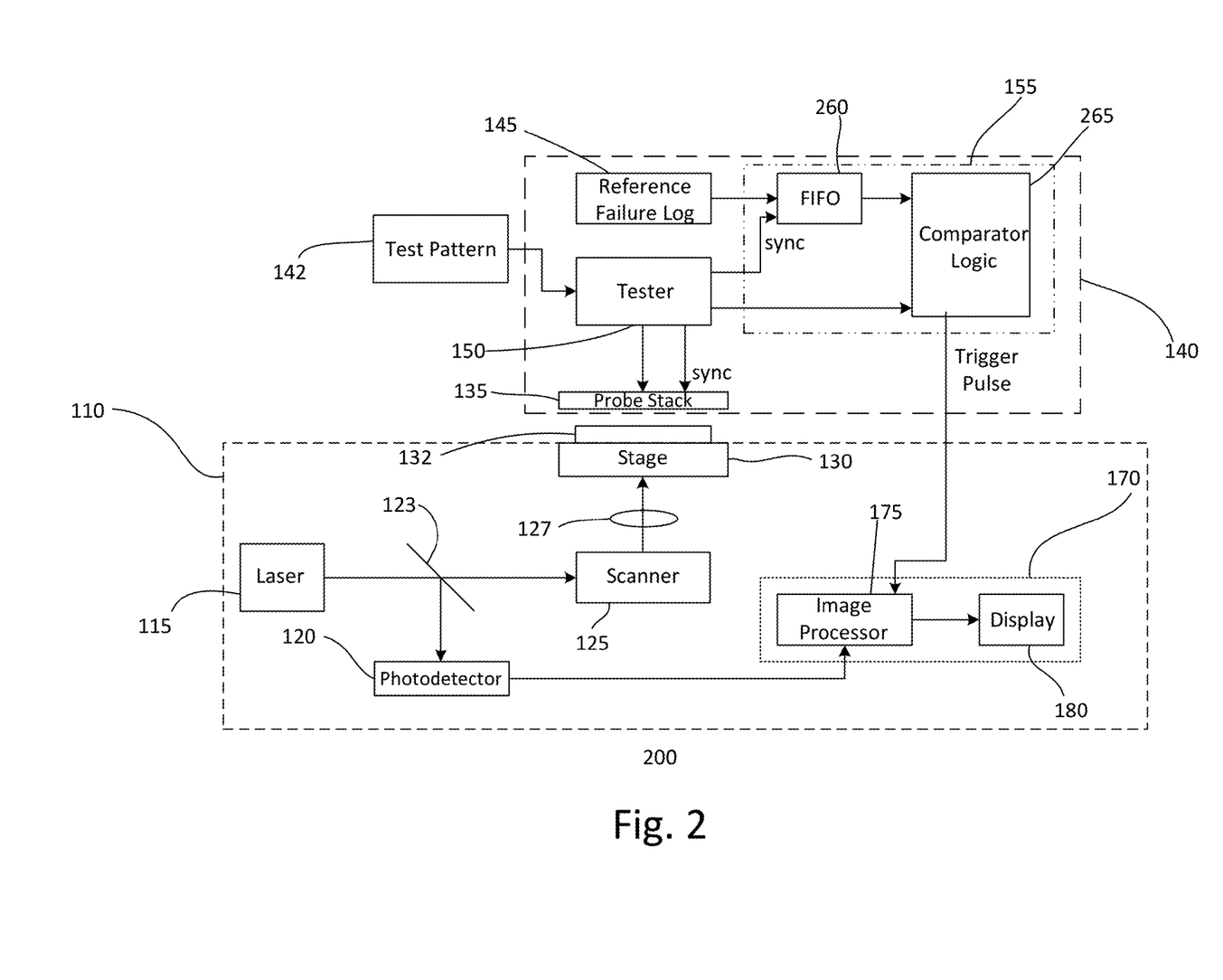

FIG. 2 shows a simplified block diagram of another analysis or test system 200. The test system is similar to the test system of FIG. 1. Common elements may not be discussed or discussed in detail. In one embodiment, the test system includes a scanning microscope module 110 and a test module 140. Providing the test system with other modules may also be useful.

In one embodiment, the comparator 155 includes a storage unit 260 and a comparator logic unit 265. The storage unit, in one embodiment, is a first in first out (FIFO) logic unit. The FIFO logic unit, for example, is a FIFO storage unit, such as a shift register or a storage array. Other types of storage units may also be useful. The FIFO storage unit is configured to store the prior failed vectors of the reference failure log. For example, the FIFO storage unit is sufficient to contain the failing compare vectors. A failing compare vector is shifted out for comparison by the comparator logic unit according to the test cycle of the test run. The comparator logic may include an AND comparator logic. Other types of comparator logics may also be useful.

In one embodiment, the comparator logic unit includes a programmable comparator logic unit. For example, the logic unit may be programmed to compare only failing compare vectors of a prior failure signature. For example, the comparator logic unit can be programmed to ignore comparing failing compare vectors in the prior reference failure log which are not part of the failure signature during a test run. When the cycle of a failing compare vector is tested, the shift register outputs the failing compare vector to the comparator logic unit for comparison. If the failing compare vector is part of the failure signature, it is compared with the output test vector to see if there is a defect. If not, the comparator logic unit skips comparing the failing compare vector with the output test vector. After the test run, the comparator logic unit generates a trigger pulse if the failure signature is detected.

Figure 3:
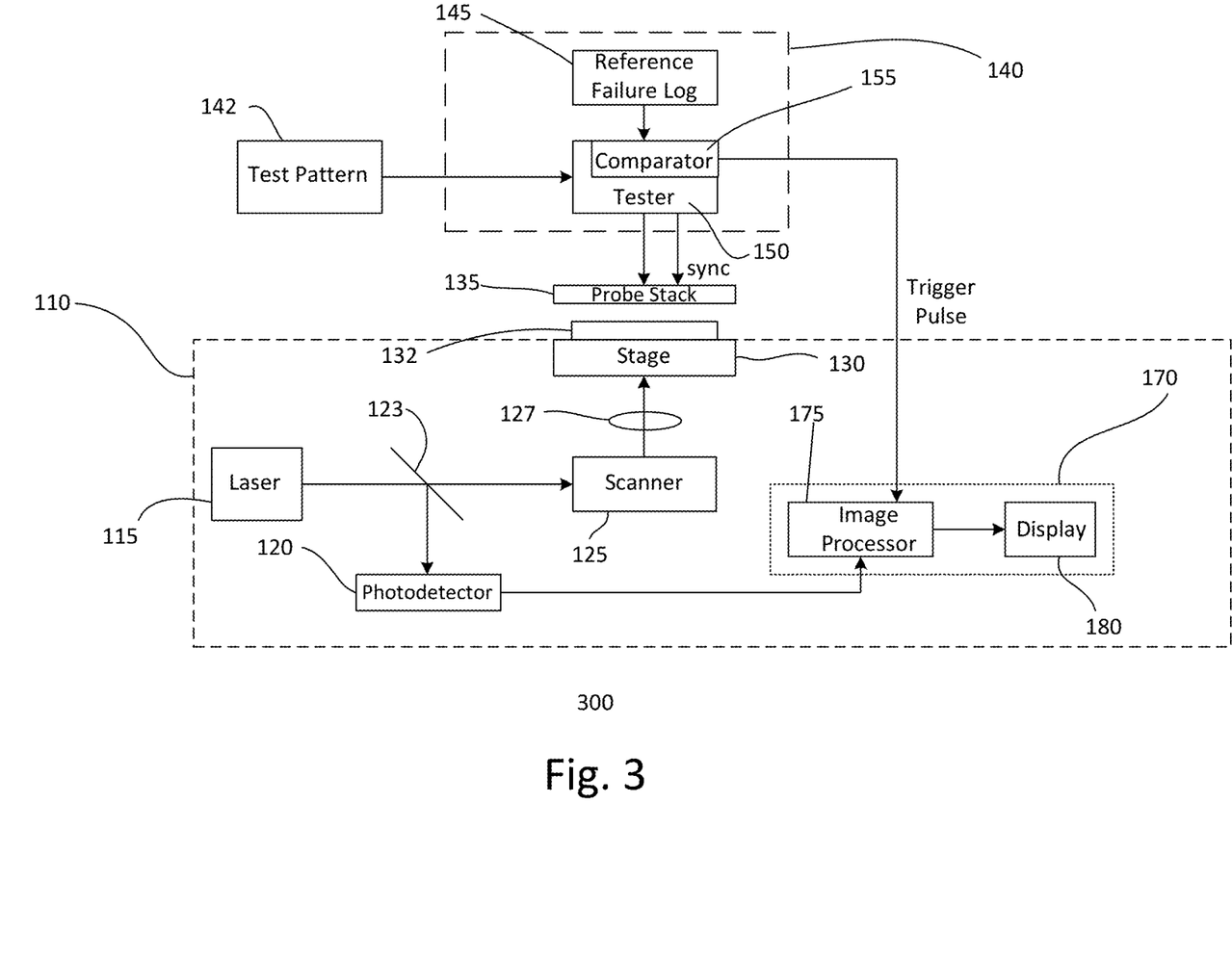

FIG. 3 shows a simplified block diagram of another analysis or test system 300. The test system is similar to the test system of FIGS. 1-2. Common elements may not be discussed or discussed in detail. In one embodiment, the test system includes a scanning microscope module 110 and a test module 140. Providing the test system with other types of modules may also be useful.

In one embodiment, the comparator unit 155 is integrated with the tester unit. The comparator unit may be that described in FIG. 2 with logic components which are integrated as part of the tester unit. In other embodiments, the comparator unit may be implemented as software and hardware. Other configurations of the comparator unit may also be useful. The comparator unit is configured to compare the test output vectors with the failing compare vectors of a failure signature from the reference failure log unit 145, as previously described.

Figure 4:
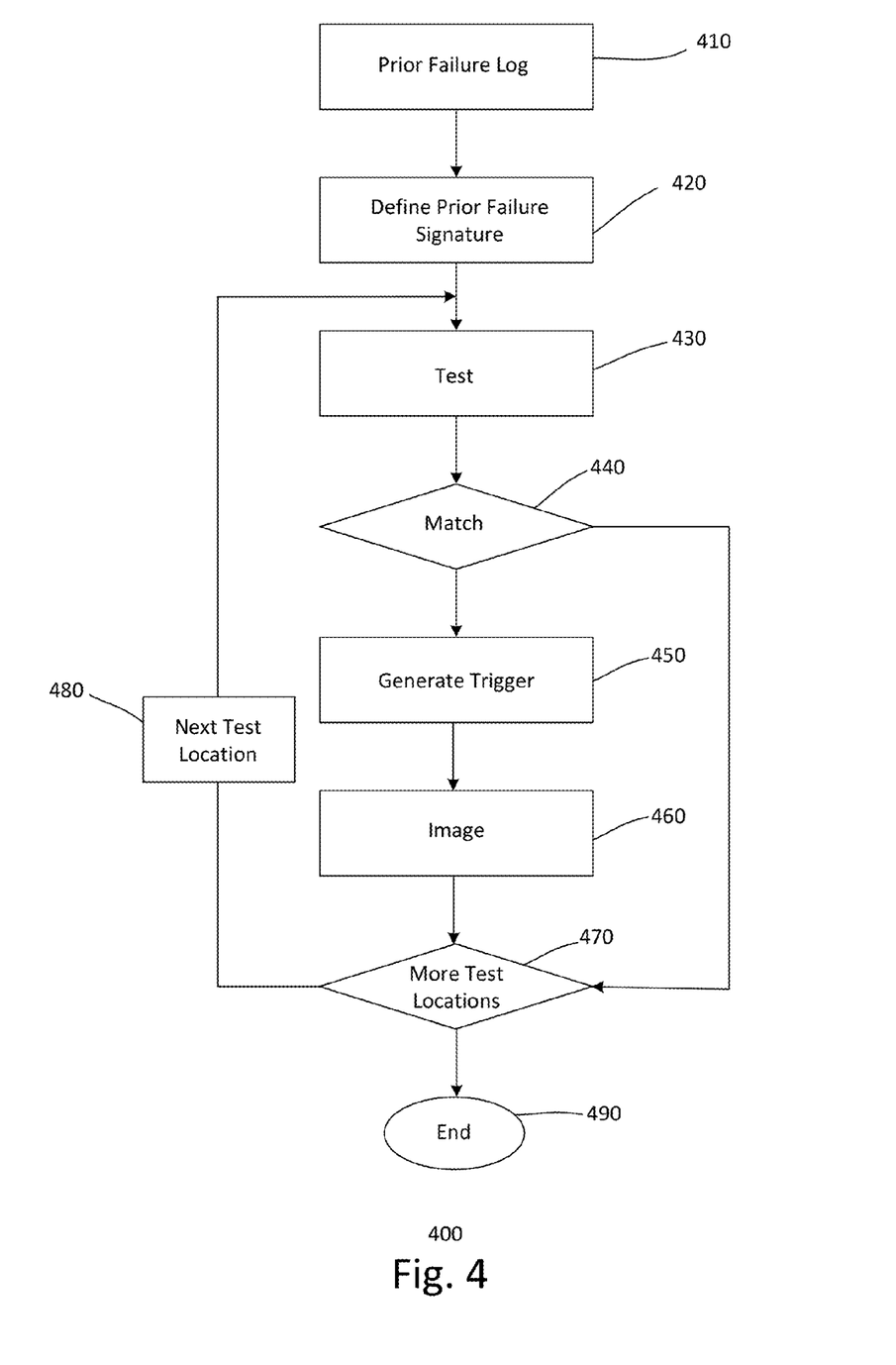
FIG. 4 shows an embodiment of a test process.

FIG. 4 shows an embodiment of a process 400 for testing a DUT. As shown, a prior reference failure log is obtained at step 410. The prior reference failure log, for example, is obtained from a sort test of failed ICs. Prior failed vectors from the sort test may be compiled to form the reference failure log. The prior reference failure log may serve as the prior failure reference log unit. From the prior reference failure log, a user may define a prior failure signature at step 420. The prior failure signature may be tailored to a desired test stringency of the user.

At step 430, the tester unit tests a DUT with a test pattern. At a test location or pixel, a test run of the test pattern is performed. In one embodiment, the tester tests the DUT on the fly, as described. The comparator tests an output test vector with a failing compare vector at the test cycle of the test run. For example, the comparator tests an output test vector with a failing compare vector at the exact test cycle or a delay of one cycle of the test run. After the end of the test run, the comparator determines if a failure signature is detected during the test run at step 440. If a failure signature is detected, the tester generates a trigger signal at step 450 to, for example, the image processor. The trigger signal causes a defect signal to be overlaid onto an image of the DUT at the location of the failure at step 460. At step 470, the process determines if there are more test locations to test. If there are, the scanner scans the laser to the next test location at step 480 for testing at step 430. If there are no more test locations to test, the process terminates at step 490.

Figure 5:
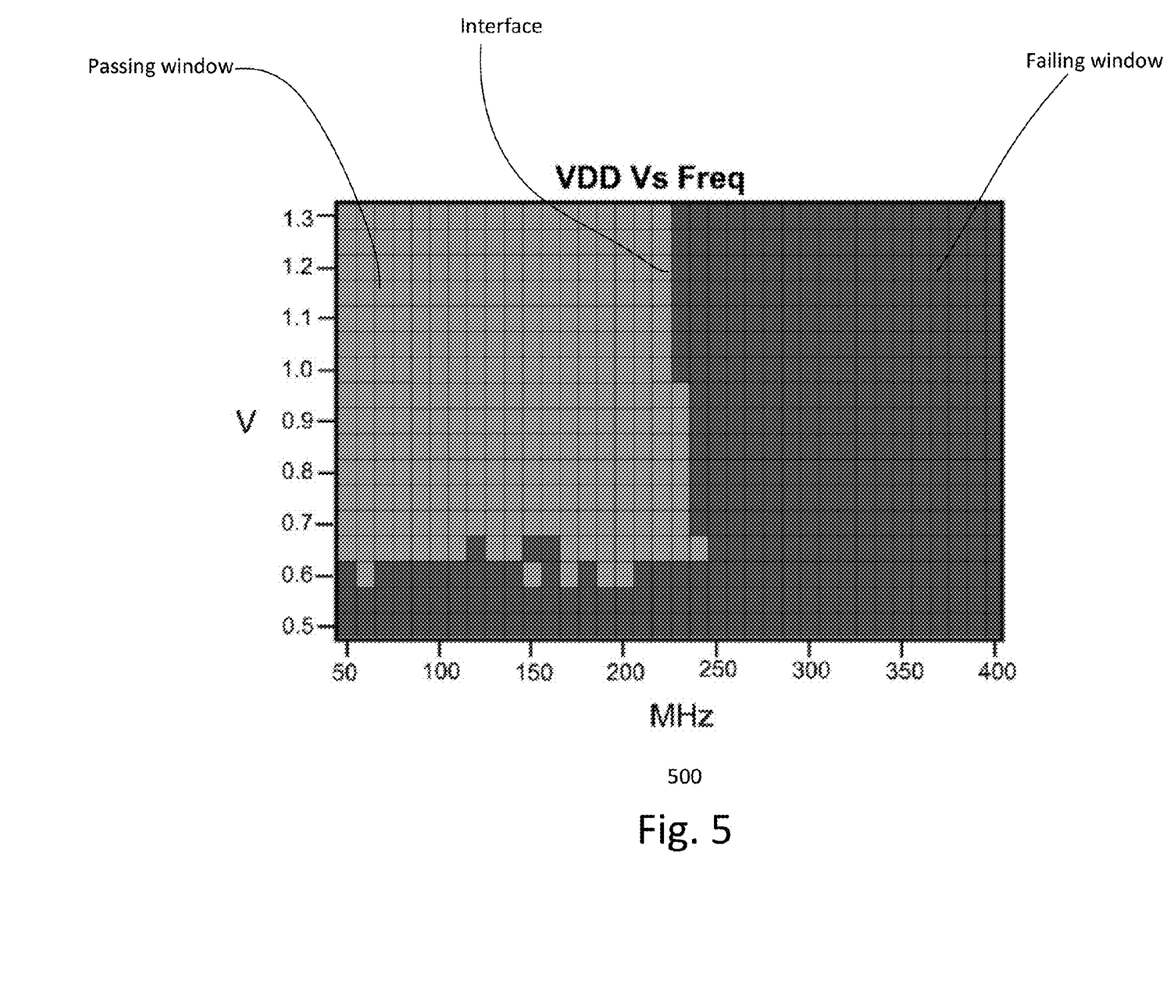
FIG. 5 shows an embodiment of a Shmoo curve.
Figure 6:
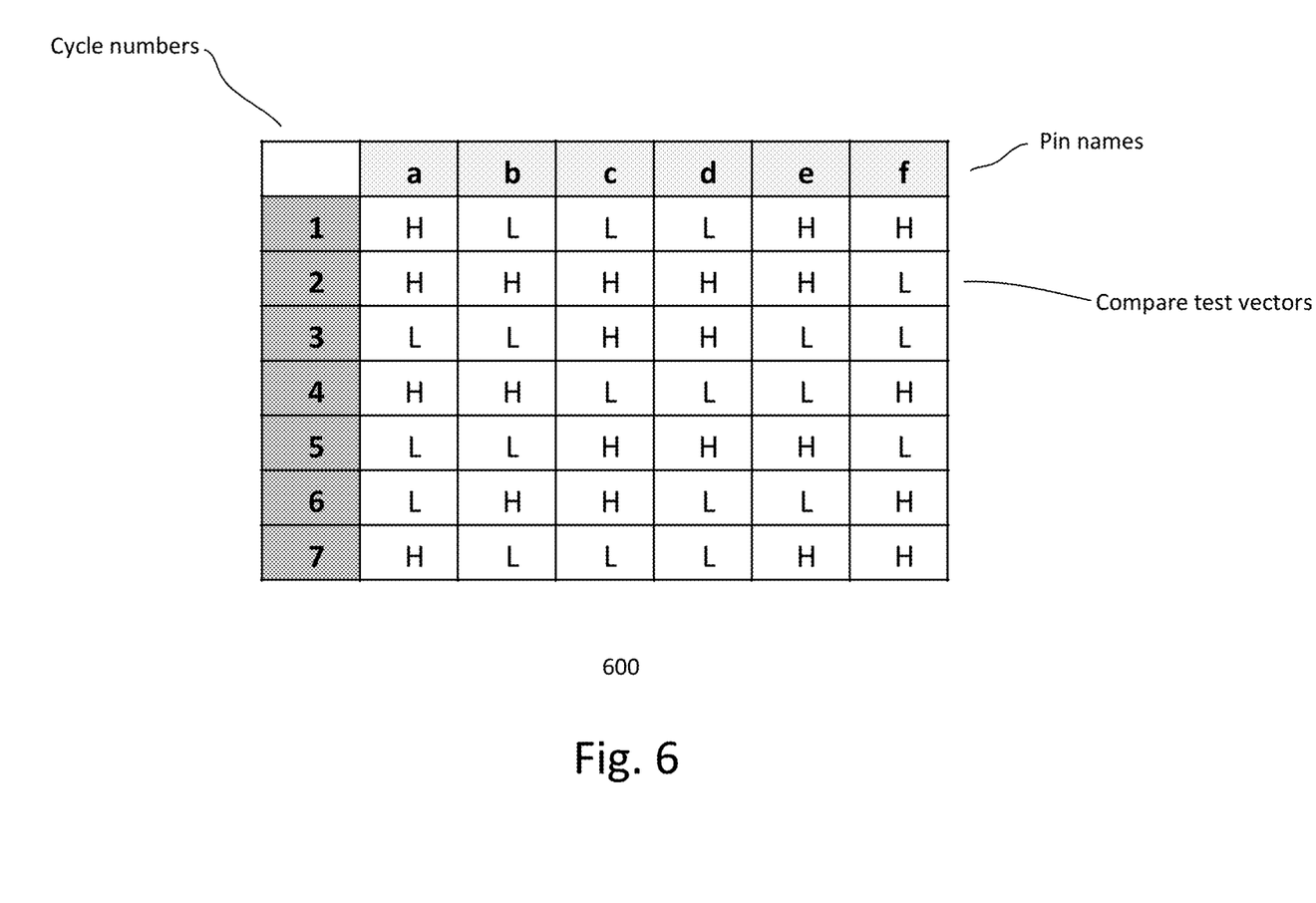
FIG. 6 shows a simplified illustration of a test pattern.

The tester tests the DUT under desired operating conditions. In one embodiment, the operating conditions are selected based on a Shmoo curve. FIG. 5 shows an exemplary embodiment of a Shmoo curve 500. The Shmoo curve is a 2-Dimensional (2-D) matrix which displays the pass/fail states of a device to be tested under varying test parameters. The test parameters may be, for example, an IC. As shown, the test parameters are power supply voltage (V) and frequency (MHz). Operating conditions which result in the IC displaying a pass state is referred to as a passing window (represented by a first shade) while the operation conditions which result in the IC displaying a fail state is referred to as a failing window (represented by a second shade). The operating conditions are generally selected in the passing window at about an interface of the passing/failing windows. Such operating conditions cause sensitive or marginal transistors to fail testing when perturbed by the laser, FIG. 6 shows a simplified illustration of a test pattern 600. As shown, the test pattern includes compare test vectors arranged as a matrix with cycle numbers, pin names and compare signal states. It is understood that a test pattern may include significantly more vectors, including input signals, such as from a few hundred to tens of thousands of cycles.

Figure 7:
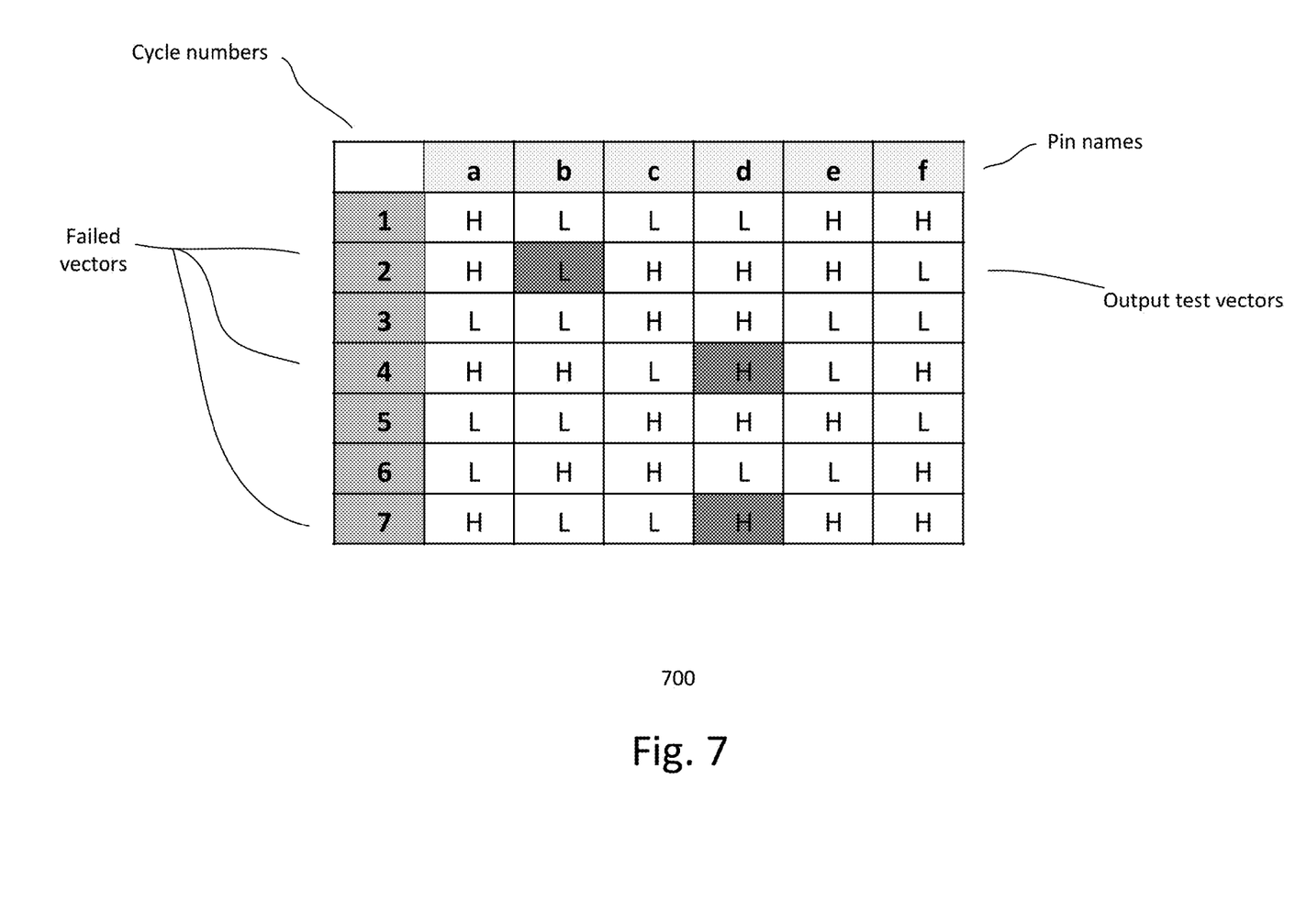
FIG. 7 shows failed test compare vectors from testing with a test pattern.

FIG. 7 shows a simplified illustration of output test vectors 700 from a test run. The output test vectors, when compared with the compare test vectors of FIG. 6, indicate failed signals which are highlighted by the shaded pins.

Figure 8A:
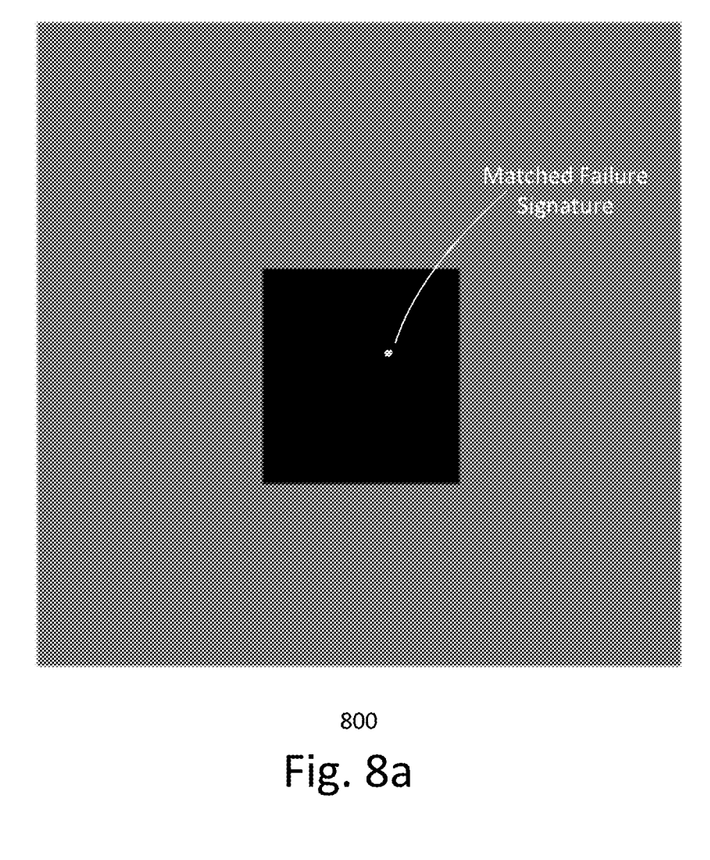
FIG. 8a shows an image of a failed location.
Figure 8B:
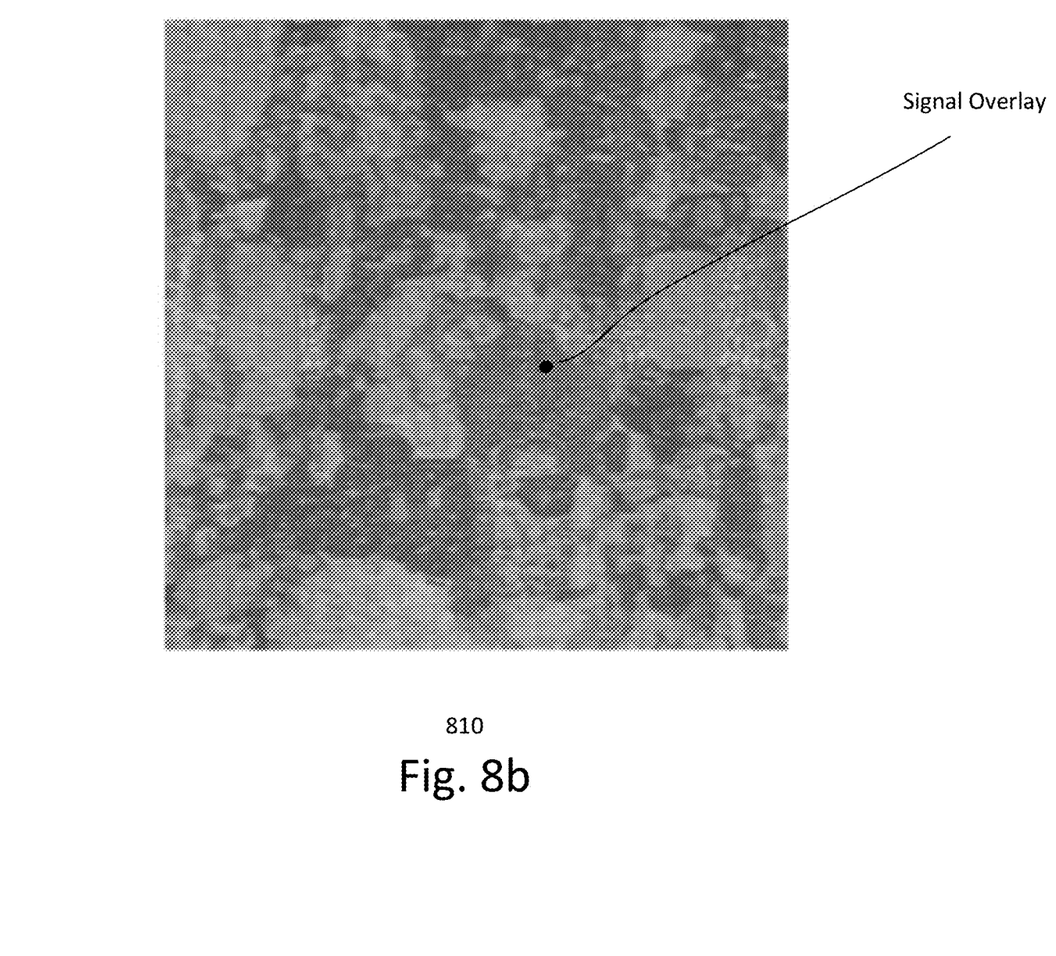
FIG. 8b shows an image of an IC with an overlaid failed location.

FIG. 8a shows an image 800 from the tester. The image includes a signal of a test site which matches a defined failure signature. For example, the test run of the location results in failed vectors which match a defined failure signature. The electrical signal is an electrical sample of the trigger pulse. FIG. 8b shows the signal of the failed test site overlaid onto an image 810 of the DUT.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A test system for testing devices comprising:
   a scanning microscope module, the scanning microscope module, when testing a device under test (DUT), is configured to perturb the DUT with a laser at a test (pixel) location; and
   a test module, the test module comprises
   a test unit,
   a reference failure log containing prior failing compare vectors of interest,
   a comparator unit, wherein the comparator unit comprises
   a first in first out storage for storing the failing compare vectors of the reference failure log, and
   a comparator logic for comparing the failing compare vectors with test vectors from the test unit, the comparator logic generates a failure signal if a test result of a test run matches a prior failure signature, and
   wherein the test module is configured to
   perform the test run at a test location of the DUT with a test pattern,
   compare test vectors of the test run with the prior failing compare vectors of interest in the reference failure log by the comparator unit, and
   generate a comparator trigger pulse if failing test vectors match the prior failure signature, the trigger pulse indicates that the test location of the DUT is a failed location.

2. The test system of claim 1 wherein the scanning microscope module comprises:
   a stage for mounting the DUT when testing the DUT;
   a laser source unit for generating a beam;
   a scanner unit for scanning the beam across the DUT;
   a focusing unit for focusing the beam onto a backside of the DUT;
   a photodetector unit for detecting a reflected beam from the DUT and generating a photodetector output signal; and
   an image processing unit for processing the photodetector output signal to generate a reflected image of the DUT.

3. The system of claim 2 wherein the failure signal is overlaid onto the reflected image of the DUT at the test location of the DUT corresponding to the comparator trigger pulse.

4. The system of claim 1 wherein the reference failure log contains the failing compare vectors of interest obtained from a sort test.

5. The system of claim 1 wherein the prior failure signature comprises a defined subset of the failing compare vectors in the reference failure log.

6. The system of claim 5 wherein the number of the failing compare vectors contained in the defined subset depends on a desired test stringency.

7. The system of claim 1 wherein generating the trigger pulse only when the test result matches the prior failure signature reduces the number of unwanted artifact failure signals from testing.

8. The system of claim 1 wherein the comparator unit is integrated into the test unit.

9. The system of claim 8 wherein generating the trigger pulse only when the test result matches the prior failure signature reduces the number of unwanted artifact failure signals from testing.

10. A method of testing a device under test (DUT) comprising:
providing a test pattern comprising test vectors with corresponding cycle numbers;
providing a prior failure log comprising prior failing compare vectors of interest from the test pattern, the failing compare vectors include the corresponding cycle numbers to the test pattern; and
testing the DUT,
wherein testing comprises testing at a test location by perturbing the DUT at the test location with a laser,
performing a test run of the test pattern at the test location,
comparing test vectors with the failing compare vectors of the prior failure log using a comparator unit, wherein the comparator unit comprises
a first in first out storage logic for storing the failing compare vectors of the prior failure log, and
a comparator logic for comparing the failing compare vectors with the test vectors from the test unit, the comparator logic generates failure signal if test result of a test run matches a prior failure signature, and
generating a comparator trigger pulse if failing test vectors matches the prior failure signature, wherein the trigger pulse indicates that the test location of the DUT is a failed location.

11. The method of claim 10 wherein the prior failure log is obtained from a sort test.

12. The method of claim 10 wherein:
the test location corresponds to a pixel location of a reflected image of the DUT; and
the comparator trigger pulse causes a failing signal to be overlaid onto the reflected image at the corresponding pixel location.

13. The method of claim 10 wherein comparing the test vectors comprises comparing corresponding test vectors of the failing compare vectors of the prior failure log.

14. The method of claim 10 wherein testing the DUT performs a test cycle on the DUT, the test cycle comprises:

a) perturbing the DUT at a first test location with a laser,
b) performing the test run of the test pattern at the first test location,
c) comparing the test vectors with the failing compare vectors of the prior failure log, and
d) generating the comparator trigger pulse if the failing test vectors matches a prior failure signature, wherein the trigger pulse indicates that the test location of the DUT is a failed location; and
repeating steps a, b, c and d for the next test location until all test locations of the DUT are tested.

15. The method of claim 14 wherein comparing the test vectors comprises comparing corresponding test vectors of the failing compare vectors of the prior failure log.

16. The method of claim 10 wherein the failure signature comprises a defined subset of failing compare vectors in the reference failure log.

17. The method of claim 16 wherein the number of failing compare vectors contained in the defined subset depends on a desired test stringency.

18. The method of claim 14 wherein comparing the test vectors with the failing compare vectors of the prior failure log and generating the comparator trigger pulse, if the failing test vectors matches the prior failure signature, reduces the number of unwanted artifact failure signals from testing.

19. A test system for testing devices to localize defects comprising:
a scanning microscope module, the scanning microscope module, when testing a device under test (DUT), is configured to perturb the DUT with a laser at a test (pixel) location; and
a test module, the test module comprises
a test unit,
a reference failure log containing prior failing compare vectors of interest,
a comparator unit, wherein the comparator unit comprises
a first in first out storage logic for storing the failing compare vectors of the reference failure log, and
a comparator logic for comparing the failing compare vectors with the test vectors from the test unit, the comparator logic generates the failure signal if the test result matches a prior failure signature, and wherein the test module is configured to
perform a test run at the test location of the DUT with a test pattern,
compare test vectors of the test run with the prior failing compare vectors of interest in the reference failure log by the comparator unit, and
generate a comparator trigger pulse only if failing test vectors match the prior failure signature, the trigger pulse indicates that the test location of the DUT is a failed location.

20. The system of claim 19 wherein the comparator unit is integrated into the test unit.

* * * * *